United States Patent
Tokarev et al.

(10) Patent No.: US 12,305,010 B2
(45) Date of Patent: May 20, 2025

(54) TRANSPARENT CONDUCTIVE BARRIER FILMS

(71) Applicant: EASTMAN CHEMICAL COMPANY, Kingsport, TN (US)

(72) Inventors: Igor Tokarev, Johnson City, TN (US); Cory James Flynn, Piney Flats, TN (US); Monika Karin Wiedmann Boggs, Kingsport, TN (US); Kara Dawn Garrett, Kingsport, TN (US)

(73) Assignee: Eastman Chemical Company, Kingsport, TN (US)

( * ) Notice: Subject to any disclaimer, the term of this patent is extended or adjusted under 35 U.S.C. 154(b) by 296 days.

(21) Appl. No.: 18/020,130

(22) PCT Filed: Jul. 21, 2021

(86) PCT No.: PCT/US2021/042510
§ 371 (c)(1),
(2) Date: Feb. 7, 2023

(87) PCT Pub. No.: WO2022/035570
PCT Pub. Date: Feb. 17, 2022

(65) Prior Publication Data
US 2023/0303773 A1 Sep. 28, 2023

Related U.S. Application Data

(60) Provisional application No. 63/064,425, filed on Aug. 12, 2020.

(51) Int. Cl.
C08J 5/18 (2006.01)
C08J 7/04 (2020.01)
(Continued)

(52) U.S. Cl.
CPC ............... *C08J 5/18* (2013.01); *C08J 7/0423* (2020.01); *C08J 7/044* (2020.01); *C08J 2379/08* (2013.01); *H10K 77/111* (2023.02)

(58) Field of Classification Search
CPC ... C08J 5/18; C08J 7/0423; C08J 7/044; C08J 2379/08; H10K 77/111; C09D 5/24; C09J 7/50; C09J 2301/30
See application file for complete search history.

(56) References Cited

U.S. PATENT DOCUMENTS

| 4,246,374 A | 1/1981 | Kopchik |
| 5,532,109 A | 7/1996 | Krounbi et al. |
| (Continued) | | |

FOREIGN PATENT DOCUMENTS

| EP | 0 494 542 A2 | 7/1992 |
| WO | WO 2006/014591 A2 | 2/2006 |

OTHER PUBLICATIONS

Notification of Transmittal of the International Search Report and the Written Opinion of the International Searching Authority, or the Declaration date of mailing Oct. 12, 2021 received in International Application No. PCT/US2021/042510.
(Continued)

*Primary Examiner* — John D Freeman
(74) *Attorney, Agent, or Firm* — Steven A. Owen

(57) ABSTRACT

Transparent, conductive barrier films are disclosed that include a polymeric substrate; an optional planarization layer, atop the polymeric substrate, and at least one dyad, atop the optional planarization layer if present, or atop the polymeric substrate, that comprises an inorganic oxide layer, and a polymethylglutarimide layer. The films of the invention are further provided with a conductive layer, atop the at least one dyad.

17 Claims, 3 Drawing Sheets

(51) Int. Cl.
  *C08J 7/044* (2020.01)
  *H10K 77/10* (2023.01)

(56) References Cited

U.S. PATENT DOCUMENTS

| | | | |
|---|---|---|---|
| 6,231,939 | B1 | 5/2001 | Shaw et al. |
| 7,022,287 | B2 | 4/2006 | Schoeniger et al. |
| 7,510,913 | B2 | 3/2009 | Moro et al. |
| 7,667,886 | B2 | 2/2010 | Danner et al. |
| 7,688,497 | B2 | 3/2010 | Danner et al. |
| 7,767,498 | B2 | 8/2010 | Moro et al. |
| 7,940,004 | B2 | 5/2011 | Padiyath et al. |
| 8,754,407 | B2 | 6/2014 | Takemura et al. |
| 10,199,603 | B2 | 2/2019 | Pierper et al. |
| 2008/0138624 | A1 | 6/2008 | Lewis et al. |
| 2014/0127518 | A1 | 5/2014 | Ishikawa |
| 2014/0138673 | A1* | 5/2014 | Shieh ............ H10D 86/60 257/43 |
| 2014/0252342 | A1 | 9/2014 | Ramadas et al. |
| 2015/0060780 | A1 | 3/2015 | Hsu et al. |
| 2016/0056297 | A1* | 2/2016 | Yu .................. H10D 99/00 257/43 |
| 2017/0197292 | A1 | 7/2017 | Ramasamy et al. |
| 2018/0233666 | A1 | 8/2018 | Ocola et al. |
| 2021/0175419 | A1 | 6/2021 | Sangwan et al. |

OTHER PUBLICATIONS

Fahlteich et al., "Transparent High Barrier Film for Organic Electronics Roll-To-Roll Pilot Production", Fraunhofer Polymer Surfaces Alliance POLO, Nov. 30, 2012, whole document.

Foulds et al., "Polydimethylglutarimide (PMGI) as a structural material for surface micromachining", Journal of Micromechanics and Microengineering, 2008, pp. 1-8.

Jung et al., "Temperature and Humidity Dependence of Response of PMGI-Encapsulated Pt-AlGaN/GaN Diodes for Hydrogen Sensing", IEEE Sensors Journal, vol. 17, No. 18, Sep. 15, 2017, pp. 5817-5822.

Legay et al., "Synthesis of Polyglutarimides from P(methyl methacrylate) and Cyclohexylamine. I. Influence of Working Conditions on Imidization Reaction", Journal of Applied Polymer Science, vol. 76, No. 13, Jun. 24, 2000, pp. 1876-1888.

Lyons et al., Web Coating and Handling Conference, "3M Multi-Layer Barrier Films for Flexible Electronic Devices", available electronically at: chrome-extension://efaidnbmnnnibpcajpcglclefindmkaj/http://toc.proceedings.com/20847webtoc.pdf, (Accessed Jul. 11, 2023).

Lyons et al., "3M multi-layer barrier films for flexible electronic devices" abstract available electronically at: https://www.researchgate.net/publication/288170917_3M_multi-layer_barrier_films_for_flexible_electronic_devices , (Accessed Jul. 11, 2023).

Rowe et al., "Barrier Film Manufacturing for OLED Solid State Lighting", 3M, DOE SSL Workshop, Feb. 1, 2017, available electronically at: chrome-extension://efaidnbmnnnibpcajpcglclefindmkaj/https://www.energy.gov/sites/prod/files/2017/02/f34/rowe_oled_longbeach2017.pdf , (Accessed Jul. 11, 2023).

Weaver et al, "Organic light-emitting devices with extended operating lifetimes on plastic substrates", Applied Physics Letters, AIP Publishing LLC, vol. 18, No. 16, Oct. 14, 2002, pp. 2929-2931.

Yan et al, "A Transparent, High Barrier, and High Heat Substrate for Organic Electronics", Proceedings of the IEEE, vol. 93, No. 8, Aug. 1, 2005, pp. 1468-1477.

\* cited by examiner

TRANSPARENT CONDUCTIVE BARRIER FILMS

CROSS-REFERENCE TO RELATED APPLICATION(S)

This application is a national stage filing under 35 USC § 371 of International Application Number PCT/US2021/042510, filed on, Jul. 21, 2021 which claims the benefit of the filing date to U.S. Provisional Application No. 63/064,425, filed on Aug. 12, 2020, the entire disclosures of which are incorporated by reference herein.

FIELD OF THE INVENTION

The present invention is generally directed to transparent, conductive barrier films, and especially those exhibiting significant moisture barrier.

BACKGROUND OF THE INVENTION

Flexible, transparent moisture barriers based on polymer/inorganic multilayers are commonly used when medium-to-high barrier performance is required. These barriers consist of single or multiple pairs of inorganic/polymer dyads deposited on a plastic substrate (typically polymer films). An increase in the number of dyads leads to an increase in the barrier performance as well as to redundancy of the stack in terms of any adverse effects caused by mechanical damage (e.g., scratches) and the environment.

U.S. Pat. No. 7,940,004 discloses a flexible barrier assembly having a flexible visible light-transmissive substrate having a Tg greater than or equal to that of heat-stabilized polyethylene terephthalate ("HSPET") overcoated with a first polymer layer having a Tg greater than or equal to that of HSPET and further overcoated with at least two visible light-transmissive inorganic barrier layers separated by at least one second polymer layer having a Tg greater than or equal to that of HSPET to mount, cover, encapsulate or form moisture- and oxygen-sensitive articles such as organic light emitting devices and light valves.

U.S. Pat. No. 7,767,498 discloses a method of encapsulating an environmentally sensitive device that includes the steps of providing a substrate; placing at least one environmentally sensitive device adjacent to the substrate; and depositing at least one barrier stack adjacent to the environmentally sensitive device, the at least one barrier stack comprising at least one barrier layer and at least one polymeric decoupling layer, wherein the at least one polymeric decoupling layer is made from at least one polymer precursor, and wherein the polymeric decoupling layer has at least one of: a reduced number of polar regions; a high packing density; a reduced number of regions that have bond energies weaker than a C—C covalent bond; a reduced number of ester moieties; increased Mw of the at least one polymer precursor; increased chain length of the at least one polymer precursor; or reduced conversion of C═C bonds. An encapsulated environmentally sensitive device is also described.

In fact, transparent barrier films incorporating multiple dyads have been reported with moisture barrier performance approaching ~$10^{-4}$-$10^{-6}$ g/m²/day levels [Lyons, C. S.; Roehrig, M. A.; Nachtigal, A. K.; Spagnola, J. C.; Bedoya, C.; Castro, D. T.; Jones, S. J., "3M multi-layer barrier films for flexible electronic devices." *Web Coating and Handling Conference* 2013 2013, 1, 665-685. (http://toc.proceedings-.com/20847webtoc.pdf; see the abstract; https://www.researchgate.net/publication/288170917_3M_multi-layer_barrier_films_for_flexible_electronic_devices]). Certain commercial films (3M UltraBarrier™ films) claim a WVTR <$5 \times 10^{-4}$ g/m²/day. [see slide 6, https://www.energy.gov/sites/prod/files/2017/02/f34/rowe_oled_longbeach2017.pdf]

However, the assembly of multilayer stacks consisting of inorganic/polymer dyads presents a major challenge because it imposes considerable limitations on how polymer layers can be deposited on top of previously created layers. A tandem in-vacuum polymer evaporation and inorganic oxide deposition system may be used, which allows the stacking of polymer and transparent inorganic oxide layers in such a way that every additional layer does not disrupt the previously deposited layers. However, this requires the development of highly specialized and sophisticated equipment leading to steep capital investments. The polymer evaporation stage cannot be easily replaced by common and less expensive wet deposition methods (gravure, slot-die, gap, roll coating, and the like). The existing polymer formulations cannot be deposited sequentially on top of each other or stacked in an alternating manner with inorganic oxides. An attempt to place a new polymer layer on top of a previously deposited stack containing the same polymer will lead to physical disruption of the stack such that its moisture or gas barrier performance is worsened or completely compromised. The reason for this is that solvents used in wet coating formulations partially re-dissolve previously deposited polymer layers.

When polymers and inorganic oxide layers alternate, the solvent may penetrate the underlying polymer layer, primarily via pinholes present in even the best-known inorganic oxide barrier layers. In this instance, the underlying polymer layer may undergo volumetric swelling in the region surrounding the pinhole that leads to irreversible damage of the delicate inorganic oxide barrier. It should thus be stressed that the barrier performance of moisture and gas barriers based on polymer/inorganic multilayers is controlled almost exclusively by their inorganic oxide constituents. The function of polymer layers is to decouple pinholes in individual inorganic oxide layers and thus create a tortuous diffusion pathway for gas or water molecules of a permeant. The present invention provides, in contrast, a wet coating formulation that does not disrupt previously deposited layers, and allows stacking multiple layers of polymer and inorganic oxide materials to achieve moisture barriers with WVTR values, for example, of $10^{-3}$-$10^{-2}$ g/m²/day, sufficient for certain practical applications such as e-ink displays.

Another common problem addressed according to the invention is the poor adhesion of most polymers to both plastic substrates, such as polyethylene terephthalate (PET) films, and inorganic oxide layers. This poor adhesion may lead to partial delamination of the barrier coating from the substrate or its constituents during multilayer stack build-up and post-production usage and handling, such as assembly with other functional components of an electrophoretic (e-ink) display.

Another problem addressed according to the invention is the need to decrease the manufacturing complexity of state-of-the-art e-ink displays, as well as their thickness and weight, for better customer experience and satisfaction. One way to achieve this is through integration of distinct functional components on a single substrate. According to the invention, a moisture barrier and a transparent conductive electrode are integrated on the same substrate. This eliminates a lamination step currently used by e-ink display manufacturers to integrate the above components.

U.S. Pat. Publn. No. 2017/0197292 discloses a method for making a polycrystalline diamond compact including the step of providing a polycrystalline diamond compact. The compact has a substrate of a hard metal composition of material and a volume of diamond material disposed on the substrate. The diamond material includes a mixture of diamond particles and a binder-catalyst. At least one pre-coating layer of organic material impermeable to a given acid or mixture of given acids is applied to at least an exterior surface of the substrate, and may be polymethylglutarimide, or PMGI.

U.S. Pat. Publn. No. 2015/0060780 discloses a multilayer construction for an organic light-emitting display device with an absorption layer formed from a resin which may be PMGI.

A continuing need exists for transparent, conductive barrier films that are easy to produce and have adequate moisture barrier.

SUMMARY OF THE INVENTION

In a first aspect, the present invention relates to transparent, conductive barrier films. The inventive films include a polymeric substrate, and an optional planarization layer, atop the polymeric substrate. The films further comprise at least one dyad, atop the optional planarization layer or the polymeric substrate, comprising: an inorganic oxide layer, and a polymethylglutarimide (PMGI) layer. The films of the invention further comprise a conductive layer, atop the at least one dyad. Optionally, a masking layer may be provided atop the conductive layer, to protect the conductive layer prior to use.

In a further aspect, the invention relates to processes for preparing transparent, conductive barrier films, that include the steps of: optionally applying a planarization layer to a polymeric substrate; applying an inorganic oxide layer on the polymeric substrate, or on the optional planarization layer; and applying a polymethylglutarimide layer, atop the inorganic oxide layer, wherein the polymethylglutarimide layer is applied as a polymethylglutarimide polymer dissolved in a solvent, and wherein the inorganic oxide layer and the PMGI layer together comprise a first dyad. Optionally, one or more additional dyads may be applied on the first dyad; and afterward, applying a conductive layer atop an uppermost dyad, to form the transparent, conductive barrier film. Optionally, a masking layer may be provided atop the conductive layer, to protect the conductive layer prior to use.

Further aspects of the invention are as disclosed and claimed herein.

BRIEF DESCRIPTION OF THE DRAWING

The invention will be described in further detail below and with reference to the accompanying drawing, wherein.

DETAILED DESCRIPTION

Figure 1:
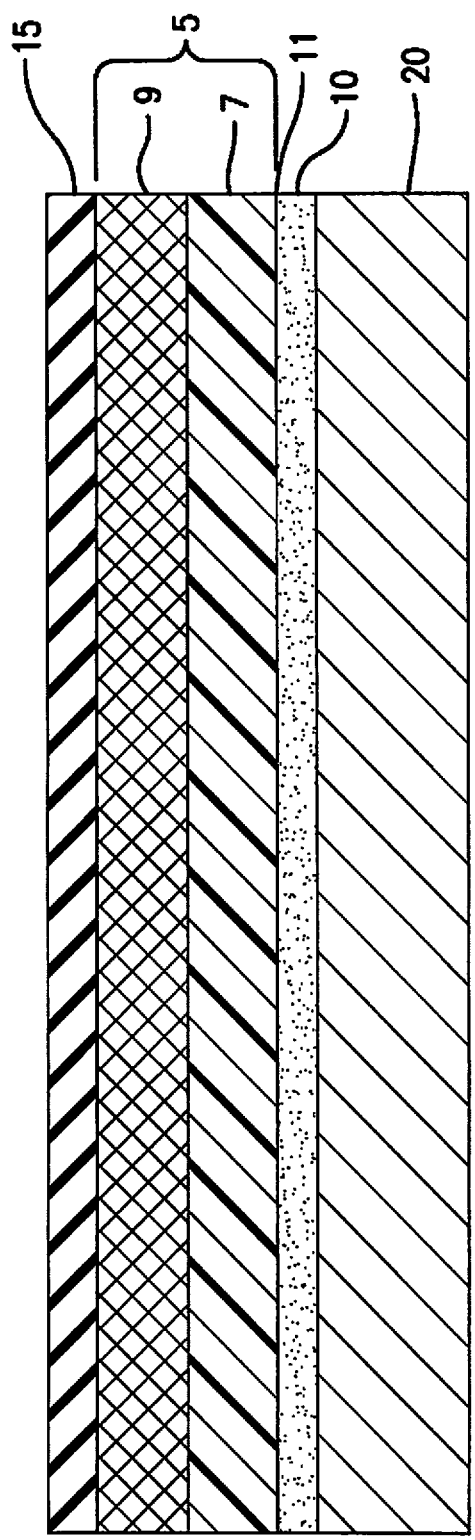
FIG. 1 is a schematic cross-section of an embodiment of a transparent, conductive barrier film of the present invention provided with one dyad.

In a first aspect, the present invention is directed to transparent, conductive barrier films. In one aspect, the inventive films comprise a polymeric substrate; an optional planarization layer, atop the polymeric substrate; at least one dyad, adjacent the planarization layer or polymeric substrate, each dyad comprising: an inorganic oxide layer and a PMGI layer; and a conductive layer, atop the at least one dyad.

In another aspect, the invention relates to methods of making transparent, conductive barrier films. The methods may comprise an optional step of applying a planarization layer to a polymeric substrate. The methods further comprise applying an inorganic oxide layer on the polymeric substrate, or on the optional planarization layer, if any; and applying a polymethylglutarimide layer, atop the inorganic oxide layer, wherein the polymethylglutarimide layer comprises a PMGI polymer dissolved in a solvent, and wherein the inorganic oxide layer and the PMGI layer together comprise a first dyad. The methods may include optionally applying one or more additional dyads on the first dyad. The methods according to the invention further comprise applying a conductive layer atop an uppermost dyad, to form the transparent, conductive barrier film.

When we say the films of the invention may be "flexible," we mean that they may not be rigid, and may be able to be bent or otherwise manipulated. In one aspect, the films may not be intended to be folded or formed into a right angle, but will have some radius or curvature, in particular encountered in a typical roll-to-roll process (process equipment rolls and film roll cores), for example from about 1.5 inch to about 1 feet.

When we say the films of the invention are "transparent," we mean that they may be seen through, and desirably do not noticeably degrade the image seen through them, making them useful, for example, as a top electrode of a display or a solar cell device. The films may thus have a visible light transmittance (Tvis), for example, of at least 95%, or at least 92%, or at least 90%, or at least 85%, or at least 80%, or at least 75%.

When we say the films of the invention are "conductive," we mean that they conduct electricity. Specifically, they may exhibit a sheet resistance, for example, of at least 1, or at least 100, or at least 1000, up to about 5,000 ohms/square, or as disclosed elsewhere herein, as measured by a four-point sheet resistance meter.

When we say a layer is atop another layer, we mean that the layer is optically adjacent the other layer, or directly in contact with the other layer, and preferably applied directly onto the layer, by a suitable application step.

The term "polymethylglutarimide" or PMGI, as used herein, refers to a polymer having repeat units of an unsubstituted or substituted methylglutarimide. These polymers are typically modified or functionalized addition polymers, such as polyacrylates, and may or may not retain significant amounts of unmodified addition polymer in the backbone, as further described herein.

Turning now to the figures which are not to scale, according to FIG. 1 a polymeric substrate 20 is provided according to the invention, and may optionally have a planarization layer 10 placed atop it, applied for example as a PMGI polymer dissolved in a solvent, to provide a suitable surface 11 for application of an inorganic oxide layer 7, provided for example by sputtering. If the planarization layer 10 is absent, the inorganic oxide layer 7 is provided directly on the polymer substrate 20. A PMGI layer 9 is applied atop the inorganic oxide layer 7, for example as a PMGI polymer dissolved in a solvent, and the inorganic oxide layer 7 and the PMGI layer 9 together form a dyad 5. According to various aspects of the invention, more than one dyad may be used, the last dyad applied being understood to be the uppermost dyad. Once the desired number of dyads is formed, a conductive layer 15 is applied atop the uppermost dyad, to form a transparent, conductive barrier film of the invention.

Figure 2:
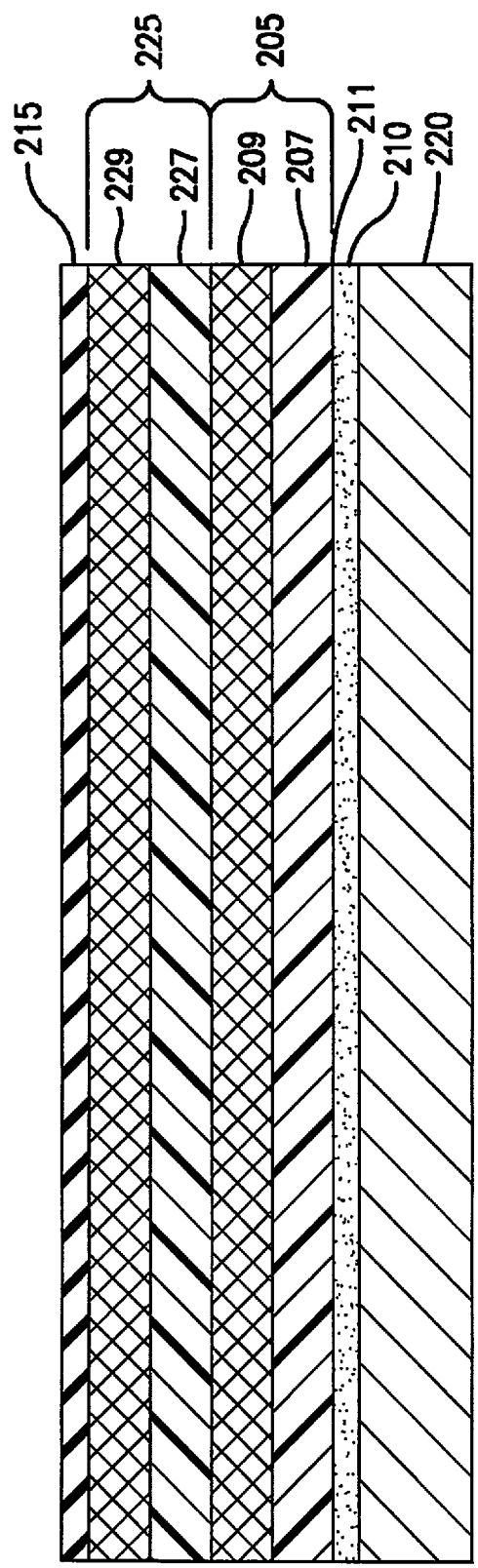
FIG. 2 is a schematic cross-section of an embodiment of the transparent, conductive barrier film of the present invention provided with two dyads.

FIG. 2 depicts an embodiment of the invention having two dyads. In this embodiment, a polymeric substrate 220 is provided according to the invention, and may optionally have a planarization layer 210 placed atop it, applied for example as a PMGI polymer dissolved in a solvent, to provide a suitable surface 211 for application of an inorganic oxide layer 207, provided for example by sputtering. If the planarization layer 210 is absent, the inorganic oxide layer 207 is provided directly on the polymer substrate 220. A PMGI layer 209 is applied atop the inorganic oxide layer 207, for example as a PMGI polymer dissolved in a solvent, and the inorganic oxide layer 207 and the PMGI layer 209 together form a dyad 205. According to this embodiment, more than one dyad is used, such that a second inorganic oxide layer 227 is applied atop the first PMGI layer 209, and a second PMGI layer 229 is applied atop the inorganic oxide layer 227 to form a second dyad 225. Once the desired number of dyads is formed, a conductive layer 215 is applied atop the uppermost dyad, in this case 225, to form a transparent, conductive barrier film of the invention.

Figure 3:
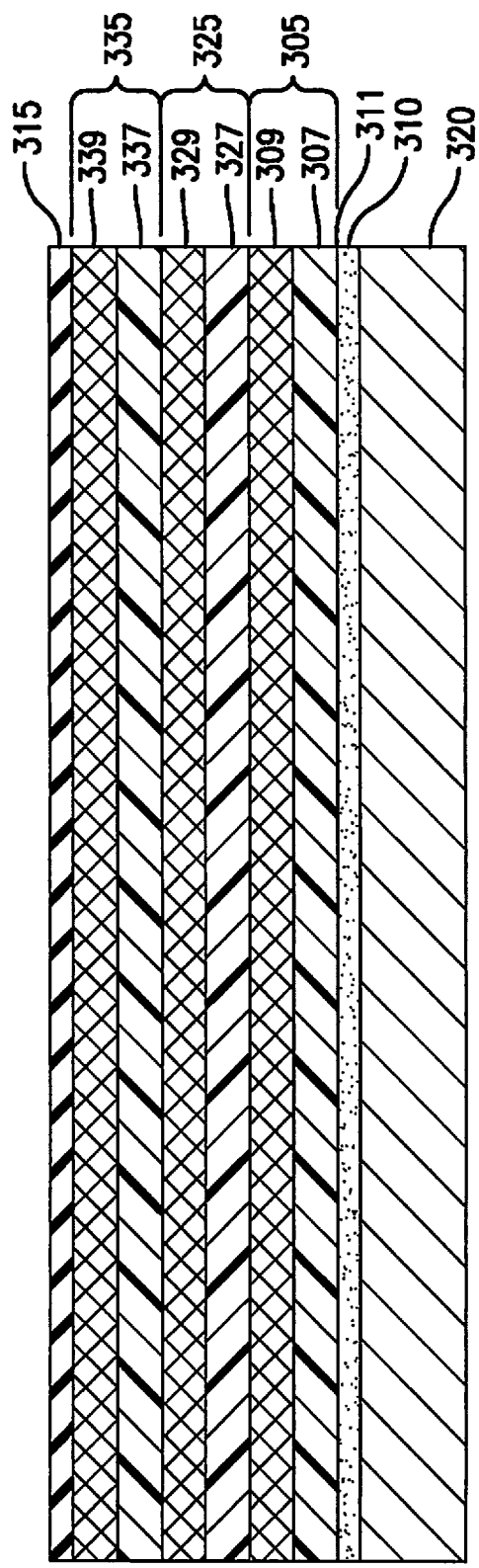
FIG. 3 is a schematic cross-section of an embodiment of the transparent, conductive barrier film of the present invention provided with three dyads.

FIG. 3 depicts an embodiment of the invention having three dyads. In this embodiment, a polymeric substrate 320 is provided according to the invention, and may optionally have a planarization layer 310 placed atop it, applied for example as a PMGI polymer dissolved in a solvent, to provide a suitable surface 311 for application of an inorganic oxide layer 307, provided for example by sputtering. If the planarization layer 310 is absent, the inorganic oxide layer 307 is provided directly on the polymer substrate 320. A PMGI layer 309 is applied atop the inorganic oxide layer 307, for example as a PMGI polymer dissolved in a solvent, and the inorganic oxide layer 307 and the PMGI layer 309 together form a dyad 305.

According to this embodiment, three dyads are used, such that a second inorganic oxide layer 327 is applied atop the first PMGI layer 309, and a second PMGI layer 329 is applied atop the second inorganic oxide layer 327 to form a second dyad 325. A further dyad is then provided, in which a third inorganic oxide layer 337 is applied atop the second PMGI layer 329, and a third PMGI layer 339 is applied atop the second inorganic oxide layer 327 to form a third dyad 335, this last dyad applied being understood to be the uppermost dyad. Once the desired number of dyads is formed, a conductive layer 315 is applied atop the uppermost dyad, to form a transparent, conductive barrier film of the invention.

The inventive transparent, conductive barrier films of the invention thus comprise a flexible, polymeric substrate. The polymeric substrate may comprise a polyethylene terephthalate or another polyester, a polyimide, a polyethylene, a polypropylene, or cyclic olefin copolymer.

The polymeric substrate may have a thickness, for example, of at least 5 um, or at least 10 um, or at least 12 um, or at least 15 um, up to about 35 um, or up to 25 um, or up to about 20 um, or even up to 100 um or 200 um or 250 um, if needed.

The polymeric substrate is desirably highly transparent, with a Tvis of at least 85%, or at least 90%, or at least 95%, or at least 98% transmission. Although haze may be an important aspect for transparent films, for certain solar applications, haze may be acceptable, although of course transparency is still relevant.

The transparent, conductive barrier films of the invention thus comprise a polymeric substrate, optionally having a planarization layer applied atop it, which may comprise PMGI. Alternatively, the planarization layer may comprise, for example, polymethylmethacrylate or polyvinyl alcohol. The planarization layer is intended to create an exceptionally smooth surface, effectively hiding surface imperfections of the substrate. The thickness of the planarization layer can range from 100 nm to 100 µm, or from 500 nm to 50 µm, or from 1 µm to 3 µm. In other aspects, the thickness may be at least 50 nm, or at least 100 nm, or at least 200 nm, or at least 250 nm, up to about 100 µm, or up to about 50 µm, or up to about 25 µm, or up to about 20 um.

The transparent, conductive barrier films of the invention may thus further comprise a planarization layer, atop the polymeric substrate.

The transparent, conductive barrier films of the invention further comprise one or more dyads, atop the planarization layer, if present, or atop the polymeric substrate, each of which dyads comprises 1) an inorganic oxide layer and 2) a polymethylglutarimide layer. The dyad atop the polymeric substrate or optional planarization layer may be called the inner most, or lower most dyad, and the dyad adjacent the conductive layer may be called the uppermost dyad. Between the lower most and the uppermost dyads may be one or more intermediate dyads. The transparent, conductive barrier films of the invention will thus comprise at least one dyad, or at least two dyads, or at least three dyads, or may comprise four, five, six, seven, eight, nine or ten dyads, or more.

The transparent inorganic oxide layer of the inner most dyad of the invention will be atop the planarization layer, if present, or atop the polymeric substrate. In various aspects, the inorganic oxide layer(s) may each comprise, for example, one or more of $SiO_2$, $Al_2O_3$, $Nb_2O_5$, $ZrO_2$, $TiO_2$, tin-doped indium oxide, aluminum-doped zinc oxide, indium-doped zinc oxide, fluorine-doped tin oxide, zinc-tin oxide, aluminum/silicate mixed oxide, or the like. When we describe these inorganic oxide layers as oxides, and provide a definite stoichiometry, we do not mean that the oxides are limited to a particular stoichiometry. Aluminum oxides in particular are understood to be mixed oxides, in which the relative amounts of aluminum and oxygen atoms may vary. Nor do we mean that the oxides are pure oxides and do not contain appreciable or significant amounts of nitrogen or carbon, that is, they may be mixed oxides, nitrides, or carbides. Typically, the inorganic oxides useful according to the invention will be predominantly oxides, with only relatively minor amounts of nitrides or carbides, for example less than 2, 3, or 5 wt. %, especially when sputtering is used. When using chemical vapor depositions, the inorganic oxides may contain significant amounts of nitrides.

The transparent inorganic oxides may be applied, for example, by physical vapor deposition (PVD) methods, which include direct current (DC) and radio frequency (RF) magnetron sputtering, electron beam/thermal evaporation, and pulsed laser deposition, a diverse family of chemical vapor deposition (CVD) methods, a special form of CVD called atomic layer deposition (ALD), as well as by wet chemistry methods, such as sol-gel chemistry, although the latter may require a post-coating high-temperature annealing step and hence may be of limited use for plastic film substrates. In various aspects, the processes may thus comprise one or more of: sputtering, wet coating, chemical vapor deposition, plasma-enhanced chemical vapor deposition, thermal evaporation, electron beam evaporation, or atomic layer deposition.

The thickness of the inorganic oxide layer(s) may be in a range from 10 nm to 500 nm, or from 20 nm to 250 nm, or from 50 to 200 nm. In various aspects, the thickness may be at least 5 nm, or at least 10 nm, or at least 15 nm, or at least 20 nm, or at least 25 nm, or at least 50 nm, up to about 1,000 nm, or up to 750 nm, or up to 500 nm, or up to 250 nm, or up to 200 nm.

The dyads of the invention further comprise a polymethylglutarimide layer, that is, a layer of a polymethylglutarimide polymer, or PMGI, applied for example as a wet coating comprising the PMGI polymer dissolved in a solvent.

The PMGI polymers, as used herein, have repeat units of an unsubstituted or substituted methylglutarimide. These polymers are typically modified or functionalized addition polymers, such as polyacrylates, and thus may or may not retain significant amounts of unmodified addition polymer in the backbone, as further described herein. The polymers may be used alone or blended with another thermoplastic, such as polyvinyl chloride.

The PMGIs useful according to the invention include those having repeat units of an unsubstituted or substituted methylglutarimide according to the following structure:

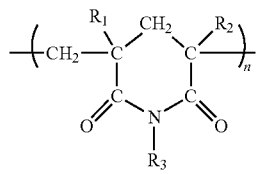

wherein R1 and R2 may be separately H or CH3 or C1-C3 alkyl, and R3 may be H, C1-C20 alkyl, substituted C1-C20 alkyl, aryl, substituted aryl, aralkyl, substituted arylalkyl, or heterocyclic. In one aspect, R1, R2, and R3 are all methyl. In another aspect, R1 and R2 are methyl and R3 is hydrogen. In another aspect, R1 and R2 are separately H or CH3 or lower alkyl, and R3 is H, C1-C6 alkyl, or substituted C1-C6 alkyl.

The PMGIs useful according to the invention include those disclosed and claimed in U.S. Pat. No. 4,246,374, and EP0494542, each of which is incorporated herein by reference in its entirety. The PMGIs useful according to the invention may be produced, for example, by reacting an acrylic polymer having acid or ester functional groups with ammonia or a primary amine.

In one aspect, the amount of repeat units of unsubstituted or substituted methylglutarimide is at least 5 weight percent, or at least 10 percent, or at least 20 weight percent, or at least 40 weight percent, or at least 50 weight percent, based on the entire weight of the PMGI.

The PMGIs useful according to the invention are typically modified or functionalized acrylic polymers. As noted in U.S. Pat. No. 4,246,374, the acrylic polymer may be any polymer containing units derived from esters of acrylic or methacrylic acid. In one aspect, the acrylic polymer may be a homopolymer of methyl methacrylate, and the amount of imidization may be from about 10% to about 100%, or at least 20%, or at least 30%, or at least 50%, or at least 70%.

The acrylic polymer can be single or multiple stage, but in the latter case the outer or final stage will contain units derived from acrylic or methacrylic acid since the imidization reaction takes place mainly in this stage. While any such acrylic or methacrylic acid esters can comprise the acrylic polymer, and can comprise any amount of the polymer, generally at least 25 percent by weight, preferably at least about 50 percent by weight, more preferably above about 80 percent, and most preferably about 95 to 100 percent by weight of the acrylic polymer is of said esters. Preferred are the species wherein the ester moiety contains 1 to 20 carbon atoms, most preferably methyl methacrylate (MMA) due to its lower cost and availability. Polymers of monomer systems comprised of at least 80 percent by weight MMA are very suitable. The acrylic polymer can contain units derived from other ethylenically unsaturated monomers such as styrene, acrylonitrile, and even such monomers as butadiene. The acrylic polymer can be a single stage polymer or can be a multiple stage polymer such as a core-shell polymer or a graft polymer, with varying degrees of grafting between stages.

Frequently the starting materials will comprise a single stage polymer dry or melt blended with a multiple stage impact modifier polymer, in which case the single stage polymer and primarily the outer stage of the multiple stage polymer are imidized. Such blends are more compatible than blends of the imidized single stage polymer with the same multiple stage polymer, especially when the latter is not imidized. Preferred are blends of single stage acrylic polymers with about 10 to 60% by weight multiple stage polymer.

The ammonia or primary amine reacted with the acrylic polymer to form the PMGI is a compound of the formula R3NH2 wherein R3 is hydrogen or substituted or unsubstituted alkyl or aryl having, for example, up to 20 carbon atoms, or according to the structure set out above.

For use in the present invention, the PMGI may have a weight average molecular weight (polystyrene as a standard) within the range, for example, of from 10,000 to 50,000, or from 15,000 to 30,000, or from 18,000 to 28,000. A suitable weight average molecular weight may be approximately 20,000, or from 15,000 to 25,000. Additionally, the glass transition temperature (Tg) of the PMGI polymer may have a value from 140° C. to 250° C., or from 150° C. to 225° C. A suitable Tg may be approximately 185° C., or more generally from 150 to 200° C.

The PMGI polymers of the invention are preferably non-crosslinked, as evidenced by solubility in dimethyl formamide (DMF). Indeed, the PMGIs of the invention are preferably applied as a wet coating, that is, they are dissolved in a solvent and applied wet, preferably with an ortho-hydroxy substituted 4-phenylazo compound provided to improve adhesion.

The PMGI layer thus comprises a PMGI that has been dissolved in a solvent. Coating formulations with PMGI require specialty solvents and solvent blends because of its poor solubility. We have discovered that the commercial formulation LOR B from Kayaku Advanced Materials, Inc., comprised of 1-20% solids PMGI, cyclopentanone, 1-methoxy-2-propanol, and a small addition of an azodye, provides the desired properties allowing unperturbed stacking of PMGI and inorganic oxide multilayers. Other solvents suitable for this use thus may include DMF, DMSO, THF, 1,3-dioxolane, etc. Those skilled in the art of solvent coating formulations would understand that trial and error may also be used, as well as informed judgement, to obtain a suitable solvent or mixture of solvents.

PMGI overall exhibits good adhesion to many inorganic substrates. Furthermore, U.S. Pat. No. 5,532,109, the relevant portions of which are incorporated herein by reference, teaches that adhesion of PMGI layers can be further improved by adding an ortho-hydroxy substituted 4-phenylazo dye, such as Sudan Orange G, which acts as a complexing ligand. PMGI formulations containing this azo dye adhesion promoter include LOR B from Kayaku Advanced Materials, Inc. We have demonstrated that LOR B shows excellent adhesion to diverse surfaces, such as PET, GX Film (Toppan Photomasks, Inc.) and IB-Film (DNP America, LLC) (both are commercial transparent flexible films for low-end barrier applications with WVTR ~$10^{-1}$ g/m$^2$/day), SiO$_2$, Al$_2$O$_3$, Nb$_2$O$_5$, ZrO$_2$, ITO, and ZTO.

As used herein, the term "transparent conductive material," means that the material is transparent, for example as already described, and is conductive, as described above with respect to the finished film. Examples include indium tin oxide (ITO), having an amount of tin oxide (SnO$_2$), for example, from about 1 to about 10 wt %. or from about 0.1% to about 20 wt. %.

Optionally, a masking layer may be provided atop the conductive layer, to protect the conductive layer prior to use. The masking layer may comprise, for example, a polymeric substrate with a low-peel-release-force adhesive. The masking layer may be applied, for example, by simple lamination.

The invention thus relates to the design and fabrication of flexible transparent conductive films which are low-permeability moisture barriers. The moisture barriers are thus multilayer stack assembled on a flexible polymeric substrate and comprised of alternating PMGI polymer and inorganic oxide layers. A key aspect is that, according to the invention, the polymer layers can be integrated into the stack by wet deposition methods. The use of wet coating deposition methods eliminates the need for highly specialized tandem vacuum coating deposition equipment and makes possible the assembly of complex, multilayer stacks using conventional deposition equipment, such as roll-to-roll sputter and reverse gravure coating machines.

According to the invention, a coating formulation based on polymethylglutarimide (PMGI) thus enables the assembly of robust, defect-free multilayer barrier stacks, as just described, with water vapor transmission (WVTR) rates as low as $10^{-4}$ or $10^{-3}$ or $10^{-2}$ g/m$^2$/day. In other aspects, the water vapor transmission (WVTR) rates may be from about $10^{-4}$ to $10^{-1}$ or $10^{-3}$ to $10^{-2}$ or $10^{-3}$ or $10^{-1}$. As seen in the examples, sufficiently low WVTR's were not attainable with other tested polymer coating formulations. Another key aspect of the invention is an integration of a moisture barrier and a conductive electrode in a single structure. Having multiple functionalities in a single structure enables decreasing the cost and manufacturing complexity of multicomponent electrophoretic (e-ink) displays and other functional devices that require an incorporation of the functions of electrical conductivity, low moisture permeability, and optical transparency.

The invention provides moisture barriers based on polymer/inorganic multilayers, or dyads, with WVTR values ranging, for example, from about $10^{-3}$ to about $10^{-2}$ g/m$^2$/day, which can be assembled using a combination of wet deposition methods for polymer layers and sputter deposition methods for transparent inorganic oxide layers. It was discovered that the use of a polymethylglutarimide (PMGI), formulated for example with a suitable solvent and a coalescent to provide suitable wetting and drying properties, allows assembly of a multilayer structure comprised of multiple polymer/inorganic oxide dyads, where an addition of a new dyad does not disrupt the previously formed structure. PMGI is used as a lift-off resist for microelectronics manufacturing applications. PMGI is optically transparent and offers excellent conformal and planarizing properties, also making it an excellent planarizing layer for intrinsically non-ideal plastic substrates.

Coating formulations with PMGI require specialty solvents and solvent blends because of its poor solubility. We have found that the commercial formulation LOR B from Kayaku Advanced Materials, Inc., comprised of 1-20% solids PMGI, cyclopentanone, 1-methoxy-2-propanol, and a small addition of an azodye, provides the desired properties allowing unperturbed stacking of PMGI and inorganic oxide multilayers.

A transparent, conductive barrier film according to the invention may thus be assembled on a polymeric substrate, and optionally starts with a planarization layer, which may be PMGI. The planarization layer creates an exceptionally smooth surface, effectively hiding surface imperfections of the substrate. The thickness of the planarization layer can range, for example, from 100 nm to 10 µm, or from 500 nm to 10 µm, or from 1 µm to 3 µm, or as disclosed elsewhere herein.

Suitable materials for a planarization layer may include PMGI, polymethylmethacrylate, or polyvinyl alcohol, or the like. The planarization layer may be formed from a polymer as just described in combination with a suitable solvent, such as already described.

Next steps include sequential depositions of dyads comprised of a layer of a transparent inorganic oxide, such as SiO$_2$, Al$_2$O$_3$, Nb$_2$O$_5$, ZrO$_2$, ITO, ZTO, or the like, and a layer of PMGI. The thickness of the inorganic oxide layer can be in a range from 10 nm to 500 nm, or from 20 nm to 250 nm, or from 50 to 200 nm. The thickness of the PMGI layer can be in a range, for example, from 10 nm to 10 µm, or from 100 nm to 10 µm, or from 200 nm to 3 µm, or as described elsewhere herein. These layers may be applied using methods already described.

After a desired number of dyads is formed, the entire multilayer is topped with a layer of a transparent conductive material, such as indium tin oxide (ITO). The target thickness of the ITO layer depends on the desired level of electrical conductivity.

The resulting structure represents a transparent conductive coating with a low-permeability moisture barrier. Optical and moisture barrier properties are controlled by the number of dyads in the multilayer and by the thicknesses of individual layers. An increase in the number of dyads leads to an improvement of the barrier properties. On the other hand, the optical properties, being specifically quantified by the visible transmittance (Tvis), are a function of the optical properties of individual layers and their thicknesses. There is an overall trend towards decreasing Tvis by adding more dyads.

While the compositions of the present invention have been described above in detail with respect to exemplary embodiments with end-use utilities, it will be understood by the person of ordinary skill that the compositions of the present invention may be utilized in a wide variety of end-use applications The following examples set forth suitable and/or preferred methods and results in accordance with the invention. It is to be understood, however, that these examples are provided by way of illustration and nothing therein should be taken as a limitation upon the overall scope of the invention.

EXAMPLES

The PMGI layers of the examples were deposited from a LOR 30B solution by a drawdown method using a #6 Meyer rod, and were heated at 80° C. for 5 minutes immediately following the drawdown. The Al$_2$O$_3$ and ITO layers were prepared by DC Magnetron sputter deposition with thicknesses calibrated via stylus profilometry. All the sputtering targets were obtained from Kurt J. Lesker Company and had the purity exceeding 99.9%. Moisture permeability was measured with Mocon Aquatran Model 1 and reported as water vapor transmission rates, WVTR (g/m²/day) The stacks with the ITO top layer were conductive with a sheet resistance of ~400 Ohms/sqr.

Table 1 shows examples of the coating formulations that yielded smooth, optically transparent coatings. It turns out that most of the coatings did not provide a sufficient level of adhesion to either PET film or inorganic oxide layers or both as determined by a tape adhesion test. The notable exceptions, as exemplified here, were coatings based on PMGI, certain grades of cellulose acetate butyrate (CAB), and a composite of poly(vinyl alcohol) (PVA) and clay. Among the three, only the PMGI-based coatings deposited from the LOR B solution could be stacked on top of each other or in an alternating manner with inorganic oxide layers without producing visible defects. For many examples in Table 1, defects were visible to an unaided eye as a considerable loss of the coating smoothness, whereas in few instances, defects could only be detected in an optical microscope as swollen regions around pinholes. The coating based on Eastman CAB-551-0.01 is an example of the latter. The PMGI- and CAB-based formulations were selected, along with sputtered $Al_2O_3$, for creating a multilayer stack and their performance as moisture barriers was compared as described below.

TABLE 1

Examples of the wet coating formulations tested.

| Coating formulation | Solvent(s) | Coating thickness (μm) | Tape adhesion test | Visual defects |
|---|---|---|---|---|
| Kayaku LOR 30B | Cyclopentanone, 1-methoxy-2-propanol | 2.5 | Passed | No |
| Kayaku 950 PMMA A4 | Anisole | 1.2 | Failed | Yes |
| Kayaku 950 PMMA A4 + 1-5% adhesion promoter | Anisole | 1.2 | Failed | Yes |
| Vitel V1200B | 75% THF + 25% cyclohexanone | 1.2 | Failed | Yes |
| GPOSS + 5% photoinitiator | MEK | 2.9 | Failed | Yes |
| GPOSS + 5% photoinitiator + 0.2-2% adhesion promoter | Cyclopentanone | | Failed | Yes |
| Polysciences WL2000 | PGMEA | 5.9 | Failed | Yes |
| Eastman CAB-551-0.01 | MPK | 4.2 | Passed | Yes |
| Eastman CAB-381-20 | 50% n-butyl acetate, 35% xylene, 15% isobutanol | 1.0 | Failed | Yes |
| Eastman CAB-381-2 | 50% n-butyl acetate, 35% xylene, 15% isobutanol | 1.0 | Failed | Yes |
| 2% PVA + 1% clay (1:1 w/w) | Water | 0.2 | Passed | Yes |

The Kayaku 950 PMMA A4 coating formulation in Table 1 was obtained from Kayaku Advanced Materials, Inc and used as supplied. The corresponding coatings were made by the drawdown deposition method using a Meyer rod #24. After deposition the coatings were dried on a hot plate at 80° C. for 5 mins. A polymeric adhesion promoter BYK-4511 from BYK GmbH was added to some formulations to promote adhesion of coatings to substrates.

The Vitel V1200B coatings formulation in Table 1 was prepared by dissolving the Bostik Vitel® 1200BP copolyester resin in a solvent blend of 75 wt % tetrahydrofuran (THF) and 25 wt % cyclohexanone. Coatings were made using drawdown deposition and a Meyer rod #10 and dried on a hot plate at 80 C for 5 mins. The Vitel® 1200BP resin has a limited solubility and it was hypothesized that this property would enable layer stackability.

The 30% solids GPOSS-based formulation in Table 1 was prepared using Glycidyl Polyhedral Oligomeric Silsesquioxanes (GPOSS) cage mixture from Hybrid Plastics Inc. and a cationic photoinitiator Chivacure 1176 from Chitec Technology Co., Ltd. Coatings were deposited by the drawdown method using a Meyer rod #6, allowed to air dry for a few minutes and then UV cured using the DYMAX light curing system for 30 seconds. The polymeric adhesion promoter BYK-4511 from BYK GmbH was added to some formulations, as noted, to promote adhesion of coatings to substrates.

The Polysciences WL2000 epoxy based protective and photoresist coating formulation from Polysciences, Inc. was used as supplied and deposited by the drawdown method using a Meyer rod #6. The coatings were allowed to air dry for a few minutes and then UV cured using the DYMAX light curing system for 30 seconds.

The compositions of the cellulose acetate butyrate (CAB) formulations are given in Table 1. CAB-551-0.01, CAB-381-20 and CAB-381-2 were obtained from Eastman Chemical Company. The CAB coatings were made by drawdown deposition and dried on a hot plate at 80° C. for 5 mins. Another formulation tested was a blend of CAB-551-0.01 and Kayaku PMMA A4 (1:1 w/w by solids). The idea behind the blend was to use CAB as an adhesion promoter to enhance adhesion of PMMA to sputtered inorganic oxide surfaces.

The aqueous PVA-clay formulation in Table 1 was prepared by blending a 2 wt % polyvinyl alcohol (PVA) solution and a 1 wt % bentonite clay dispersion in a 1:1 w/w ratio. PVA (M.W. 9-10 kg/mol, 80% hydrolyzed) and natural bentonite clay Cloisite Na+ were obtained from Sigma-Aldrich and BYK GmbH, respectively. PVA-clay coatings were made by drawdown deposition using a Meyer rod #10 and allowed to air dry for 1 hour prior to testing. The polymer-clay composite coatings approach was inspired by the referenced study (Walther, A.; Bjurhager, I.; Malho, J.-M.; Pere, J.; Ruokolainen, J.; Berglund, L. A.; Ikkala, O., Large-Area, Lightweight and Thick Biomimetic Composites with Superior Material Properties via Fast, Economic, and Green Pathways. Nano Lett. 2010, 10, 2742-2748.) that demonstrated transparent ultrathin PVA-clay coatings where high-aspect-ratio platelets self-aligned parallel to the substrate plane during the deposition and formed a dense overlapping layer. The premise was that the overlapping clay platelets will create a long torturous path for diffusion of water molecules and hence will act as an efficient barrier for moisture permeation by itself.

The moisture permeability of a 4 mil PET was compared to an $Al_2O_3$ coated PET and showed a 70-fold decrease. A second modification was made to add an layer of ITO further decreased the WVTR by a factor of ~1.6×. This indicates that both the $Al_2O_3$ and ITO offer a significant benefit to lowering the moisture transmission of the stack. Utilizing 2.5 μm thick PMGI layers below each sputtered inorganic material yielded a further 6-fold decrease in the moisture transmission rate. The PMGI is not expected to impart a significant contribution to lowering the WVTR. The spatial separation of inorganic oxide layers with polymer layers is required for a good barrier performance (low moisture permeability). The lowering of the WVTR with its presence indicates a synergistic effect such as decoupling of the pinholes. Decreasing the thickness of the $Al_2O_3$ layer was found to have limited effect on the moisture transmission rate but has benefit to the cost of manufacturing. An increase in the number of the LOR B/$Al_2O_3$ dyads from one to two leads to an improvement of the barrier performance. Therefore, a multilayer stack on a 4 mil PET substrate consisting of two 2.5 µm thick PMGI and $Al_2O_3$ dyads with a 20 nm thick ITO leads to up to a 1,000-fold reduction of the moisture permeability compared to the bare PET substrate. In this example, in Table 2, the visible transmittance gradually decreases by adding new layers to the multilayer stack.

TABLE 2

WVTR and L* values of multilayer barrier stacks of different designs.

| Stack description | WVTR (g/m²/day) | L* |
|---|---|---|
| PET | 5.13 | 96.7 |
| PET/200 nm $Al_2O_3$ | $73.2 \times 10^{-3}$ | — |
| PET/200 nm $Al_2O_3$/ITO | $46.1 \times 10^{-3}$ | — |
| PET/PMGI/200 nm $Al_2O_3$/PMGI/ITO | $(7.4 \pm 2.5) \times 10^{-3}$ | 94.7 |
| PET/PMGI/75 nm $Al_2O_3$/PMGI/ITO | $(7.3 \pm 3.7) \times 10^{-3}$ | 94.2 |
| PET/PMGI/75 nm $Al_2O_3$/PMGI/75 nm $Al_2O_3$/PMGI/ITO | $(5.2 \pm 0.1) \times 10^{-3}$ | 94.0 |

*L* values are known to correspond roughly to Tvis values

Comparative Example

A two dyad film structure was built with PMGI layers as well as an identical structure utilizing Eastman CAB-551-0.01 layers (Table 3). The CAB material results in an unwanted 33-fold increase in the water vapor transmission rate compared to the PMGI layer. Upon visual inspection of the CAB-based films, defects were observed under the optical microscope, which appeared to be related to solvent swelling of the lower polymer layers through the pinholes of the inorganic material.

TABLE 3

WVTR Comparison of PMGI and CAB polymer systems.

| Stack description | WVTR (g/m²/day) | Visual Defects |
|---|---|---|
| PET/PMGI/75 nm $Al_2O_3$/PMGI/75 nm $Al_2O_3$/PMGI/ITO | $5.2 \times 10^{-3}$ | No |
| PET/CAB/75 nm $Al_2O_3$/CAB/75 nm $Al_2O_3$/CAB/ITO | 0.17 | Yes |

A single dyad film structure was made to show the difference between a PMGI only structure and a mixed PMGI/CAB system (Table 4). The mixed system shows an unwanted ~5-fold increase in the water vapor transmission rate compared to the PMGI only system. This further indicates that the optimal performance of the film structure was unique to the PMGI material.

TABLE 4

WVTR Comparison of PMGI only and mixed polymer systems.

| Stack description | WVTR (g/m²/day) |
|---|---|
| PET/PMGI/75 nm $Al_2O_3$/PMGI/ITO | $(7.3 \pm 3.7) \times 10^{-3}$ |
| PET/PMGI/75 nm $Al_2O_3$/CAB/ITO | $35 \times 10^{-3}$ |

Other inorganic oxide layers are also suitable for the purpose of this invention. A notable example is a two-dyad stack of PET/2.5 µm PMGI/75 nm ZTO/2.5 µm PMGI/20 nm ITO stacks, where ZTO is a sputtered layer. This structure provided a very good consistency in the barrier performance with the WVTR values of 3.4±0.3 mg/m²/day and the optical properties with Tvis of 83.1% and L* of 92.8. Adding an extra PMGI/ZTO dyad allowed further reduction of the moisture permeability with WVTR approaching ~1.7 mg/m²/day.

The foregoing description of various embodiments of the invention has been presented for purposes of illustration and description. It is not intended to be exhaustive or to limit the invention to the precise embodiments disclosed. Numerous modifications or variations are possible in light of the above teachings. The embodiments discussed were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

That which is claimed is:

1. A transparent, conductive barrier film, comprising:
   a. a polymeric substrate;
   b. optionally, a planarization layer, atop the polymeric substrate;
   c. at least one dyad, atop the optional planarization layer if present, or atop the polymeric substrate, comprising:
      i. an inorganic oxide layer, and
      ii. a polymethylglutarimide layer; and
   d. a conductive layer, atop the at least one dyad.

2. The transparent, conductive barrier film of claim 1, wherein the film comprises at least two dyads.

3. The transparent, conductive barrier film of claim 1, wherein the polymethylglutarimide layer comprises repeat units of an unsubstituted or substituted methylglutarimide according to the following structure:

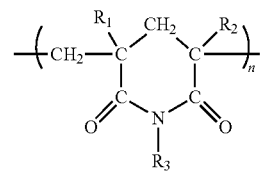

wherein R1 and R2 may be separately H or CH3 or C1-C3 alkyl, and R3 may be H, C1-C12 alkyl, substituted C1-C20 alkyl, aryl, substituted aryl, aralkyl, substituted aralkyl, or heterocyclic.

4. The transparent, conductive barrier film of claim 1, wherein the polymeric substrate comprises a polyethylene terephthalate or a polyimide.

5. The transparent, conductive barrier film of claim 1, wherein the planarization layer comprises polymethylglutarimide.

6. The transparent, conductive barrier film of claim 1, wherein the inorganic oxide layer comprises aluminum oxide, and the conductive layer comprises indium tin oxide.

7. The transparent, conductive barrier film of claim 1, wherein the inorganic oxide layer comprises zinc tin oxide, and the conductive layer comprises indium tin oxide.

8. The transparent, conductive barrier film of claim 1, wherein the film has a sheet resistance of less than 5,000 ohms/square.

9. The transparent, conductive barrier film of claim 1, wherein the film has a sheet resistance of less than 1,000 ohms/square.

10. The transparent, conductive barrier film of claim 1, wherein the film has a Tvis of at least 70%.

11. The transparent, conductive barrier film of claim 1, wherein the film is a top electrode of a solar cell device.

12. The transparent, conductive barrier film of claim 1, wherein the film is a top electrode of a display.

13. The transparent, conductive barrier film of claim 1, further comprising a masking layer, atop the conductive layer.

14. A process for preparing a transparent, conductive barrier film, comprising:

a. optionally applying a planarization layer to a polymeric substrate;
b. applying an inorganic oxide layer on the optional planarization layer, or on the polymeric substrate;
c. applying a polymethylglutarimide layer, atop the inorganic oxide layer, wherein the polymethylglutarimide layer is applied as a polymethylglutarimide polymer dissolved in a solvent, and wherein the inorganic oxide layer and the polymethylglutarimide layer together comprise a first dyad;
d. optionally applying one or more additional dyads on the first dyad; and
e. applying a conductive layer atop an uppermost dyad, to form the transparent, conductive barrier film.

15. The process of claim 14, wherein the planarization layer is present and is applied as a polymethylglutarimide polymer dissolved in a solvent.

16. The process of claim 14, wherein the inorganic oxide layer is applied by a process selected from sputtering, wet coating, chemical vapor deposition, plasma-enhanced chemical vapor deposition, thermal evaporation, electron beam evaporation, or atomic layer deposition.

17. The process of claim 14, further comprising applying a masking layer, atop the conductive layer.

* * * * *